(12) United States Patent
Callahan (10) Patent No.: US 10,082,099 B2
(45) Date of Patent: Sep. 25, 2018

(54) PORT EDGE SHAPE WITH CONTINUOUS CURVATURE FOR IMPROVED RING-PORT INTERACTION AND FLOW AREA

(71) Applicant: ACHATES POWER, INC., San Diego, CA (US)

(72) Inventor: Brian J. Callahan, San Diego, CA (US)

(73) Assignee: ACHATES POWER, INC., San Diego, CA (US)

( * ) Notice: Subject to any disclaimer, the term of this patent is extended or adjusted under 35 U.S.C. 154(b) by 0 days.

(21) Appl. No.: 15/277,930

(22) Filed: Sep. 27, 2016

(65) Prior Publication Data

US 2018/0045135 A1 Feb. 15, 2018

Related U.S. Application Data

(63) Continuation-in-part of application No. 15/232,183, filed on Aug. 9, 2016.

(51) Int. Cl.
*F02F 1/18* (2006.01)
*F02B 75/28* (2006.01)
(Continued)

(52) U.S. Cl.
CPC ............... *F02F 1/18* (2013.01); *F02B 75/28* (2013.01); *F02F 1/186* (2013.01); *F02F 1/22* (2013.01); *G06F 17/50* (2013.01)

(58) Field of Classification Search
CPC .... F02B 75/28; F02B 2075/025; F02B 25/08; F02B 53/04; F02B 25/06; F02B 25/04; F02B 2720/236
See application file for complete search history.

(56) References Cited

U.S. PATENT DOCUMENTS

| 2,170,020 A | 8/1939 | Gerlach | 123/51 |
| 4,337,734 A | 7/1982 | Iio | 123/65 PE |

(Continued)

FOREIGN PATENT DOCUMENTS

GB 483211 A 4/1938

OTHER PUBLICATIONS

Anonymous, "Ellipse", Jan. 1, 2016, Retrieved from the Internet: URL:https://www.mathcurve.com/courbes2d/ellipse/ellipse.shtml [retrieved on Oct. 11, 2017].

(Continued)

*Primary Examiner* — Long T Tran
(74) *Attorney, Agent, or Firm* — Terrance A. Meador; Julie J. Muyco (57) ABSTRACT

A port opening edge shape for a port in a cylinder of an opposed-piston combustion engine is optimized for flow area, as well as for minimization of piston ring clipping. The port opening edge shape includes a top edge, a bottom edge, a first and second side edge connecting the top and bottom edge, and an apex in the top edge. The apex has the minimum radius of curvature of the port opening edge shape. A spline that defines the port opening edge shape can be calculated based upon a maximum height, a full width, an amount or degree of skew, and a minimum radius of curvature. A model can measure values for engine performance and determine which spline defines a port opening edge shape yields a desired engine performance.

5 Claims, 9 Drawing Sheets (51) Int. Cl.
 *G06F 17/50* (2006.01)
 *F02F 1/22* (2006.01)

(56) References Cited

U.S. PATENT DOCUMENTS

| | | | |
|---|---|---|---|
| 4,458,636 A | 7/1984 | Kania | 123/73 R |
| 4,651,686 A | 3/1987 | Kania | 123/65 P |
| 5,086,734 A | 2/1992 | Nakai | 123/65 PE |
| 5,398,646 A | 3/1995 | Kuroshita et al. | 123/65 PE |
| 6,092,494 A * | 7/2000 | Davis | F02B 25/14 |
| | | | 123/65 PE |
| 8,757,113 B2 * | 6/2014 | Chrisman | F02B 33/12 |
| | | | 123/73 PP |
| 8,851,029 B2 | 10/2014 | Callahan et al. | 123/46 R |
| 9,068,498 B2 | 6/2015 | Callahan | F02B 25/08 |
| 2010/0192923 A1 | 8/2010 | Cox | 123/51 BC |
| 2010/0288253 A1 | 11/2010 | Chrisman | 123/73 PP |
| 2011/0232599 A1 * | 9/2011 | Chrisman | F02B 33/12 |
| | | | 123/193.6 |
| 2012/0145137 A1 * | 6/2012 | Shirai | F02F 1/22 |
| | | | 123/73 R |
| 2012/0186561 A1 | 7/2012 | Bethel | 123/51 R |
| 2014/0216425 A1 | 8/2014 | Callahan | 123/65 P |

OTHER PUBLICATIONS

International Search Report dated Oct. 18, 2017, for PCT application No. PCT/US2017/043758.
Mittler, et al., "Understanding the Fundamentals of Piston Ring Axial Motion and Twist and the Effects on Blow-By", Proceeding of the ASME Internal Combustion Engine Division 2009 Spring Technical Conference, ICES2009-76080, May 3-6, 2009, Milwaukee, Wisconsin.
Paul H. Schweitzer, "Scavenging of Two-Stroke Cycle Diesel Engines", Chapter 6, pp. 50-54, The Macmillan Company: New York, copyright 1949.
Non-Final Office Action dated Mar. 21, 2018, for U.S. Appl. No. 15/232,183.

* cited by examiner

PORT EDGE SHAPE WITH CONTINUOUS CURVATURE FOR IMPROVED RING-PORT INTERACTION AND FLOW AREA

RELATED APPLICATIONS

This application is a continuation-in-part of U.S. patent application Ser. No. 15/232,183, filed Aug. 9, 2016, titled "PORT EDGE SHAPE WITH CONTINUOUS CURVATURE FOR IMPROVED RING-PORT INTERACTION AND FLOW AREA," the disclosures of which are hereby incorporated by reference herein.

This application contains subject matter related to that of U.S. Ser. No. 12/931,199, filed Jan. 26, 2011 for "Oil Retention in the Bore/Piston Interfaces of Ported Cylinders in Opposed-Piston Engines", published as US 2012/0186561 on Jul. 26, 2012, U.S. Ser. No. 13/385,127, filed Feb. 2, 2012 for "Opposed-Piston Cylinder Bore Constructions with Solid Lubrication in the Top Ring Reversal Zones", now U.S. Pat. No. 8,851,029, and U.S. Ser. No. 13/757,220, filed Feb. 1, 2013 for "Reduction Of Ring Clipping In Two-Stroke Cycle Engines", now U.S. Pat. No. 9,068,498.

FIELD

The field of the methods and apparatus described herein relate to port constructions for two-stroke cycle engines. Particularly, the field includes the port openings in engine cylinder liners.

BACKGROUND

A two-stroke cycle engine is an internal combustion engine that completes a power cycle with a single complete rotation of a crankshaft and two strokes of a piston connected to the crankshaft. One example of a two-stroke cycle engine is an opposed-piston engine in which a pair of pistons is disposed in opposition in the bore of a cylinder. The pistons are disposed crown-to-crown in the bore for reciprocating movement in opposing directions. The cylinder has inlet and exhaust ports that are spaced longitudinally so as to be disposed near respective ends of the cylinder. The opposed pistons control the ports, opening the ports as they move to their bottom dead center (BDC) locations, and closing the ports as they move toward their top dead center (TDC) locations. One of the ports provides passage of the products of combustion out of the bore, the other serves to admit charge air into the bore; these are respectively termed the "exhaust" and "intake" ports.

Each port includes one or more arrays of circumferentially-spaced openings through the sidewall of the cylinder. In some descriptions the openings themselves are called ports. However, in this description, a "port" refers to a circular area near an end of a cylinder in which a collection of port openings is formed to permit the passage of gas into or out of the cylinder. The port openings are separated by bridges (sometimes called "bars") that support transit of the piston rings across the ports.

The pistons are equipped with one or more rings mounted to their crowns. The skirt, lands, and rings of each piston create a seal that prevents gas flow into or out of the port that the piston controls. Any tangential tension of a ring in its constrained state in the bore causes a radial force outward. Thermal deformation due to combustion heat adds to this force. This radial force causes the ring to deflect in an outward radial direction of the bore into the port openings as the ring traverses the port. When the ring must travel back into the bore (i.e., in an inward radial direction of the bore), which happens as the port closes and also as it opens fully, the ring must be guided radially inward of the bore.

If the geometry of a port opening edge at the bore surface is not well designed, the distance over, and hence the time during, which the ring is allowed to move radially inwardly of the bore can be too short. This shortened period to move radially can increase the inward acceleration of the ring, and hence raise the contact force and stress. This motion is called "ring clipping" (or "port clipping" or "port sticking") and is undesirable. Ring clipping causes an overloaded condition in which the lubricant film acting between the bore and an outer ring surface which contacts the bore is pierced and asperities of the ring and bore surfaces begin to contact. This causes undue wear and increases friction, which leads to localized heating and high temperatures. These high temperatures can weaken the metals of the ring and cylinder. Weakened metals in the piston ring and engine cylinder can plastically deform when exposed to high contact stress during ring clipping. This plastic deformation of the ring and cylinder disrupts the geometry and roughens the surface texture, exposing more asperities. If the metals are active enough, then fusion can occur between the piston ring and cylinder sidewall. Fusion of plastically deformed parts can lead to scuffing, evidenced by torn, smeared, folded, and piled ring and/or cylinder material. Maximum contact stress is reduced by limiting the acceleration of the ring into and out of the port openings. Acceleration is reduced by spreading out the radial motion of the ring over time.

SUMMARY

In a cylinder for a two-stroke opposed piston engine, a port opening with a port opening edge shape that improves ring-port interaction and maximizes flow area (i.e., port area, or the area through which charge air and/or exhaust gas can flow) is provided. The port opening edge shapes can be defined by a spline that lies along or within a maximum port opening height and a defined port opening full width. The spline defining port opening edge shapes can also have a minimum radius of curvature for each point along the spline, as well as curvature continuity along the spline.

In a related aspect, a cylinder with port openings shaped to improve ring-port interaction and maximize flow area is provided. The port openings can have edge shapes defined by a spline that lies along or within a maximum port opening height and a defined port opening full width. The spline defining port opening edge shapes can also have a minimum radius of curvature for each point along the spline, as well as curvature continuity along the spline.

In some further aspects, a method for forming port openings for a cylinder for a two-stroke opposed piston engine includes defining a spline that lies along or within a maximum port opening height and a defined port opening full width, defining a minimum radius of curvature for each point along the spline, and requiring curvature continuity along the spline. The method may also include modeling engine performance for an opposed-piston engine with a cylinder with at least one port with port openings having the port opening edge shapes defined by the spline.

DETAILED DESCRIPTION OF THE PREFERRED EMBODIMENTS

Described herein are improved port openings for cylinder liners for two-stoke, opposed piston engines that allow for minimal contact force between piston rings and port openings. Methods are provided for designing the improved port openings, as well as for fabrication of cylinder liners for two-stroke, opposed piston engines with the improved port openings.

Figure 1A:
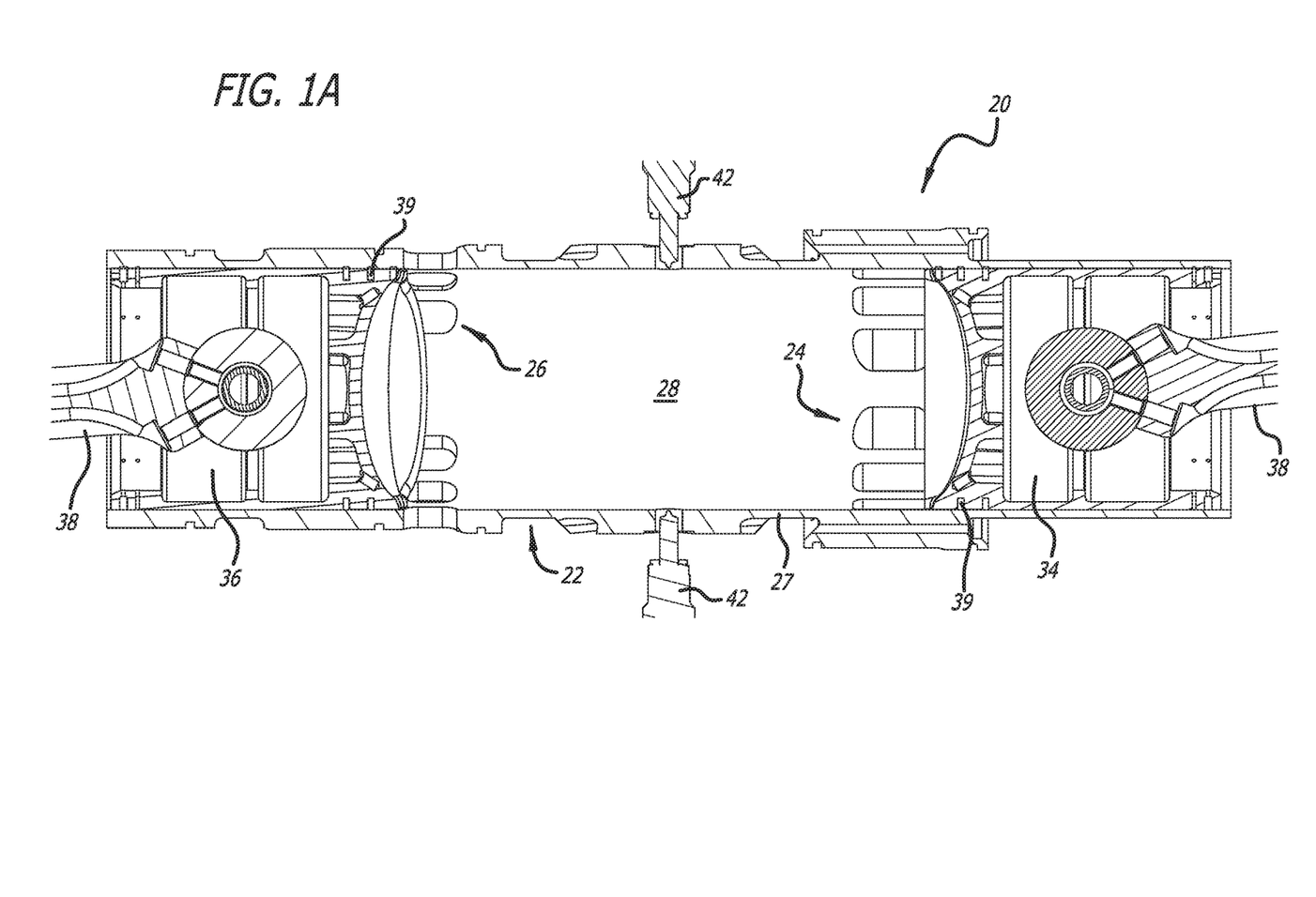
FIG. 1A is a longitudinal cross-sectional view taken through a cylinder of an opposed-piston engine constructed for two stroke-cycle operation.

As per FIG. 1A, an opposed-piston engine constructed for two stroke-cycle operation is generally indicated by reference numeral 20. The engine 20 includes a cylinder 22 with longitudinally-spaced exhaust and intake ports 24 and 26 formed in the cylinder sidewall near respective ends of the cylinder. The opposed-piston engine includes at least the one cylinder 22, and may include two, three, or more cylinders. The cylinder 22 may be constituted of a cylinder liner or sleeve supported in a block, a frame, a spar, or any other equivalent structure. The cylinder has a sidewall 27 defining a cylindrical bore having a surface 28. The openings of the exhaust and intake ports 24 and 26 are formed near respective ends of the sidewall and open through the bore surface 28. A pair of pistons 34 and 36 is disposed for opposed sliding movement on the bore surface 28. Each of the pistons is coupled by a connecting rod 38 to a respective one of two crankshafts (not seen) that are mounted outside of respective ends of the cylinder. See commonly-owned US 2012/0285422 for a more complete description of the general architecture of the engine 20. Each of the pistons 34 and 36 is equipped with one or more rings 39 that are mounted in annular grooves in the crowns of the pistons.

The pistons 34 and 36 are shown at respective positions slightly after scavenging has commenced. In this regard, the piston 36 is slightly away from its BC (e.g., bottom dead center location) location, and so the intake port 26 is just starting to close from its fully open position for transport of charge air into the cylinder. The piston 34 is farther away from its BC location because it leads the intake piston 36 and so the exhaust port 24 is also closed slightly from its fully open position for transport of exhaust gasses out of the bore. As the motion continues, the piston 34 will move from its BC location toward its TC location (e.g., top dead center location) in the interior of the bore, closing the exhaust port 24. The piston 36 will also continue to move from BC, closing the intake port 26 as it moves toward TC. After the last port closes and the pistons continue to move closer together, charge air is compressed between their end surfaces. Fuel injected through the sidewall of the cylinder via injectors 42 mixes with the pressurized charge air, ignites, and drives pistons 34 and 36 from TC to BC in an expansion stroke.

Figure 1B:
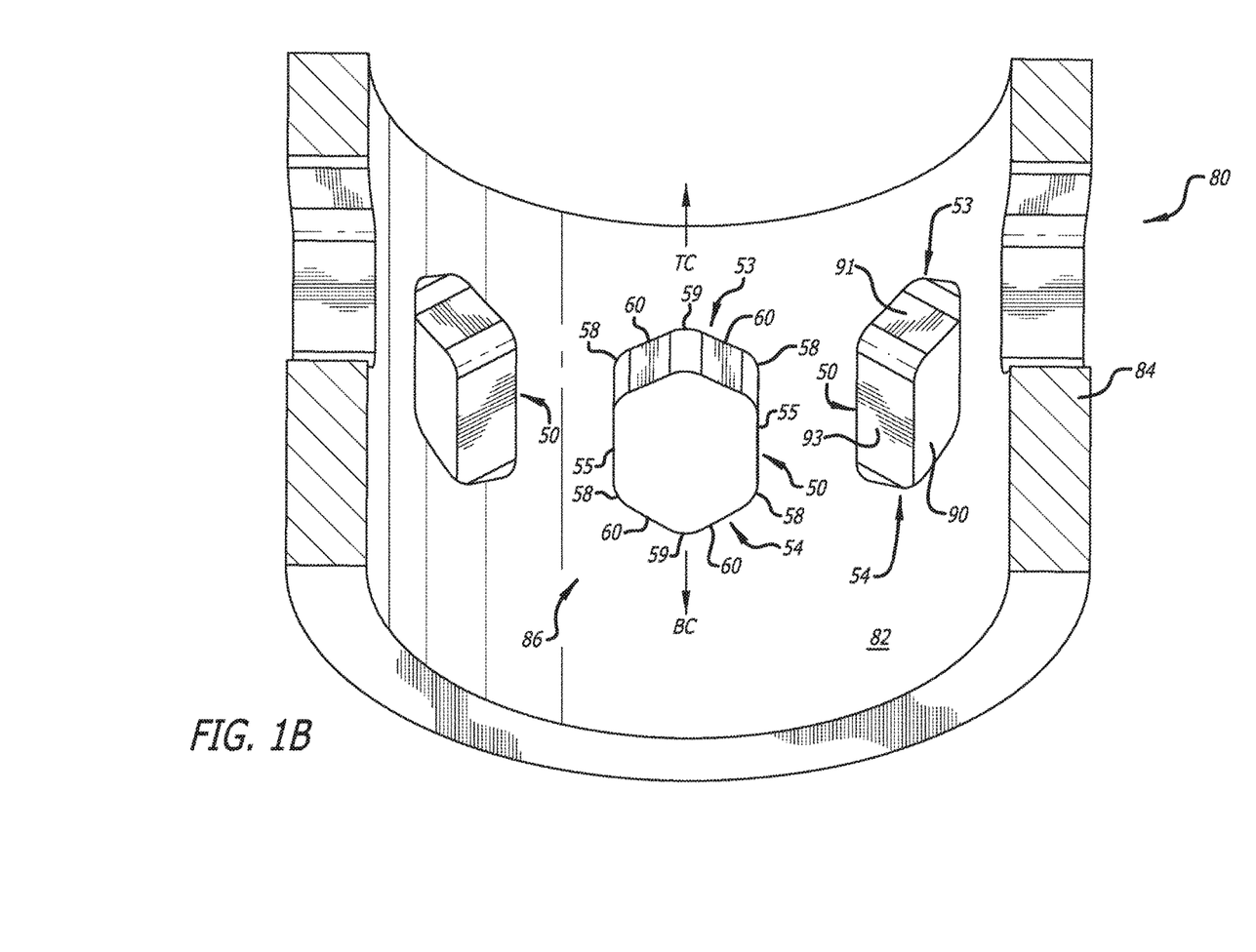
FIG. 1B is a side sectional view of one end of a cylinder for an opposed-piston engine having a port with exemplary prior art port openings.

FIG. 1B provides a closer view of a cylinder that is part of an opposed-piston engine. In FIG. 1B, reference numeral 80 indicates a ported cylinder for an opposed-piston engine constructed for two stroke-cycle operation. The arrows TC and BC indicate the directions toward the top and bottom center locations of the controlling piston. The cylinder 80 includes a bore surface 82 and a sidewall 84. The cylinder 80 also includes spaced-apart exhaust and intake ports, although only the exhaust port 86 is shown. Each port includes at least one generally circumferential array of port openings, and each port opening extends from the bore surface 82 through the sidewall 84. For example, the exhaust port 86 includes an array of port openings in which a port opening edge shape 50 in the bore surface 82 is defined by opposing top and bottom edges 53 and 54 joined by side edges 55. Each of the top and bottom edges 53 and 54 is characterized by rounded corner transitions 58 to the side edges 55, a rounded peak 59, and inclined ramp portions 60 extending from the rounded corner transitions to the rounded peak.

With reference to FIG. 1B, because the cylinder sidewall 84 has a thickness, each port opening edge shape 50 frames a passage 90 that penetrates the sidewall 84 and opens through the outer surface (not shown) of the sidewall. It is not necessary that the outer surface opening have the same shape as the port opening edge shape 50 in the bore surface 82. In fact, the opening through the outer sidewall surface generally has a different shape than the bore surface. The reason is that the thickness of the sidewall is used to form a passage shape designed to partially guide the gas flow for good in-cylinder flow structure and to minimize flow restriction through the intake and exhaust ducting. A specific flow structure of the passage 90 is useful both for scavenging and/or combustion optimization. Consequently, the resulting port opening shape through the outer sidewall surface is a complex combination of all these requirements.

In some implementations, the horizontal passage surfaces 91 of the passage 90 bordered by the top and bottom edges 53 and 54 are kept flat as the passage goes from the bore 82 to outside surface of the cylinder sidewall for machining reasons. The vertical surfaces 93 of the passage are angled for the engine performance reasons stated above. Even though this means every other face will incline toward the center of a window, only 4-axis control is needed for machining. It is not necessary to provide significant chamfer (or bevel) on the edges 53, 54, and 55 of the port opening shape 50 in this design. On the other hand, a chamfer or round on edge 53 would generally help exhaust flow during the initial port opening of the exhaust port due to reduced restriction of the gas jet.

Referring again to FIG. 1A, each of the one or more piston rings 39 has a tension that urges the ring outward, in a radial direction with respect to the longitudinal axis of the engine cylinder 22, so that an outer portion of each ring contacts the surface of the cylinder bore 28. This tension, in addition to other forces caused by combustion gases, thermal gradients in each ring, and/or the velocity of the piston and its rings as they travel through the cylinder can create a contact pressure or contact stress between each piston ring 39 and the cylinder bore surface 28. The port opening edge shape is one factor that can influence the contact pressure between a piston ring 39 and a cylinder bore surface 28 as the ring passes over a port. Port opening edge shapes that do not allow for a gradual transition, either expansion or contraction, of the piston ring as it passes over the port opening can cause undesirable motion in piston rings. That is to say, as a piston ring 39 moves longitudinally through a cylinder 22, it is also urged in a radial direction toward the bore surface 28. If there are changes to the bore surface 28, such as openings (e.g., port openings), the piston ring 39 will move due to the forces acting on it. In this case the piston ring expands outward into the openings in the cylinder sidewall as the ring passes over the openings. When the piston ring 39 transitions from a portion of the cylinder 22 with a port to a solid portion, the ring 39 responds to the various forces acting upon it and moves radially inward, toward the center of the cylinder 22. When the longitudinal distance in the cylinder over which the ring is allowed to move radially inwardly of the bore is short, corresponding to an abrupt transition from a port to a solid portion of the cylinder, the ring accelerates inward more rapidly than it would during a gradual transition. Thus, an abrupt transition can raise the contact force and stress, causing "ring clipping" (or "port clipping" or "port sticking"). Ring clipping can cause scuffing or material failure in the cylinder, ring, or piston. A piston ring travelling over a ported area with sharp transitions along the port opening edges can cause jerk. Jerk in a piston ring can lead to general loss of positional control of the ring in the engine cylinder.

In order to increase efficiency of the engine and enhance durability of the piston rings, it is desirable to reduce undesirable ring motion, for example ring clipping and jerk. A piston ring makes four transitions over a port during each complete cycle of a two-stroke opposed-piston engine. One way to reduce undesirable ring motion is to equip port openings with top and bottom edge constructions that reduce or eliminate sudden transitions of the ring into and out of the port openings, as well as provide a smooth path along the port opening edges. These types of port opening edge shapes are described below.

Figure 2A:
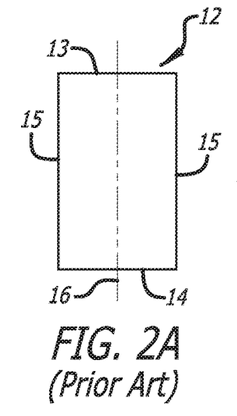
FIGS. 2A-2F illustrate prior art port opening edge shapes. In each of these figures, the view is from the interior of a cylinder in a radial direction of the cylinder toward the bore surface.

FIGS. 2A through 2F illustrate prior art port opening edge shapes in the bore surface. In each figure, the view is from the interior of a cylinder in a radial direction of the cylinder toward the bore surface. The simplest prior art port opening edge shape is seen in FIG. 2A, in which a port opening edge shape 12 includes top and bottom edges 13 and 14 joined by side edges 15. In this regard, the top edge 13 is the edge nearest the TC location of the controlling piston and the bottom edge 14 is the edge nearest the BC location of the controlling piston. The top and bottom edges 13 and 14 are oriented substantially normally to the cylinder axis 16. The side edges 15 are oriented generally longitudinally with respect to the axis. Together, the edges 13, 14, and 15 define a quadrilateral shape. For a given port width W, this provides the highest integral of open area and crankshaft rotation angle ("angle·area product") which, in turn, yields the maximum open time·area product for any given crankshaft speed. Because the capacity of a port opening to conduct gas flow is directly proportional to its time-area product, this maximizes engine efficiency or power. However, the flat top and bottom edges 13 and 14 cause a ring to move instantly outward into the port opening (and then instantly inward into the bore), resulting in ring clipping at both edges.

Figure 2B:
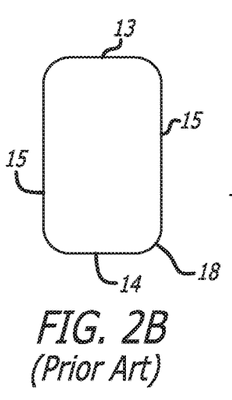

Adding corner rounds 18 to the quadrilateral shape as per FIG. 2B yields only a slight improvement over the shape of FIG. 2A. Excursion into the port opening is still substantial as the ring approaches the flat top and bottom edges, producing clipping almost as severe as the straight quadrilateral shape of FIG. 2A.

Figure 2C:
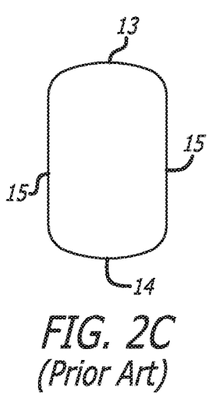

Other prior art port opening shapes are provided with elliptical or arched top and bottom edges 13, 14 as shown in FIG. 2C. These may be described by an ellipse or by three circular arcs with a major arc in the middle of the edge connected to two minor arcs in the corners. Either can be fully described with a major and a minor radius. However, an elliptical top or bottom edge with its major radius controlling the ring motion does not spread out the ring motion over a particularly long distance over the entire elliptical shape. Over most of the ellipse the motion of the ring is spread out, but at the last portion, as the elliptical form approaches its major radius, ring acceleration is quite high, thus causing excessive wear.

Figure 2D:
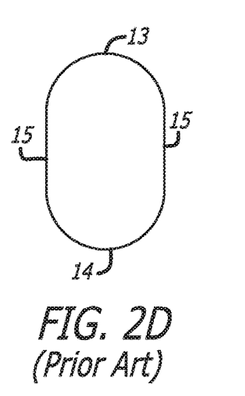

Another port opening shape shown in FIG. 2D goes to the extreme of providing each of the top and bottom edges 13, 14 with a semi-circular shape having a radius equal to half the port width. The semi-circularity does provide smoother ring transitions, which reduces wear but which also reduces the area of the port opening, thereby limiting the angle-area product.

Other prior art port opening edge shapes can reduce wear and scuffing caused by ring clipping while at the same time maintaining an angle-area product approaching that of the quadrilateral shape. By reducing the maximum contact stress caused by the surface of the ring pushing against the edge of the port, asperity contact (e.g., contact between sharp or rough areas in the bore and the ring) will be reduced, thereby avoiding scuffing and wear and enhancing the durability of the engine. At the same time, the port opening shape should provide an angle-area product approaching that of the quadrilateral shape.

Figure 2E:
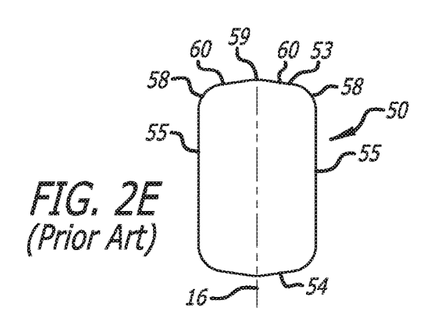

Referring now to FIG. 2E, another prior art construction for at least the exhaust port 24 includes port openings that meet the objectives and provide the benefits set forth herein. In this regard, the shape 50 of a port opening in the bore surface includes a top edge 53 and a bottom edge 54 joined by side edges 55. The top and bottom edges 53 and 54 are oriented generally transversely to the cylinder longitudinal axis 16 and are similarly constructed. Each of the edges 53 and 54 includes rounded corners, angled ramps, and a rounded peak. With reference, for example, to the top edge 53, rounded corners 58 join the top edge 53 to the side edges 55. A rounded peak 59 is disposed between the rounded corners 58 and is offset outwardly of the opening shape 50, in the TC direction of the controlling piston (not shown). Inclined ramp portions 60 extend from the rounded corners 58 to the rounded peak 59. Although the edges 53, 54, and 55 are shown in a generally rectangular shape, this is not essential, other generally quadrilateral shapes can be used, although it is preferred that the top and bottom edges 53 and 54 be oriented generally perpendicularly to the direction of piston movement in such shapes.

Figure 2F:
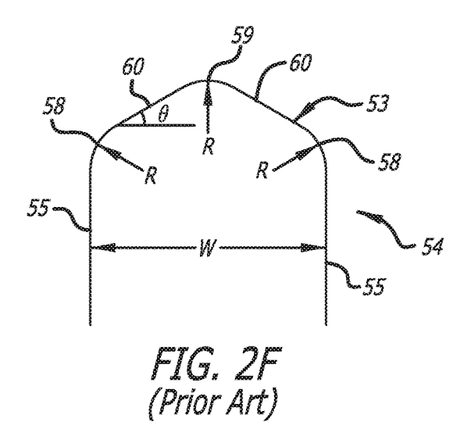

FIG. 2F is a magnified view of the top edge portion of the port opening edge shape 50 of FIG. 2E, with dimensions exaggerated in order to more clearly illustrate certain features of the shape. In the top edge, a radius R of the rounded corners 58 can be set to a minimum value dictated by manufacturing considerations, typically the radius of the intersection between a cutting tool and the bore surface; the radius of the rounded peak 59 can also be set to this minimum. Preferably, the radius R is substantially less than half of a width W measured with respect to the side edges 55. An angle θ can be set for the inclination of the ramp portions 60 so as to limit acceleration of the ring in a radial direction of the cylinder to be equal to a maximum value chosen according to desired wear limits. This maximizes the port angle·area product. For example, the value of the angle θ can be in the range 6°<θ<10°.

As described above, as a piston ring moves longitudinally (i.e., axially) through an engine cylinder, the ring moves radially in accordance with the forces acting upon it. As the piston ring passes over a port, it will expand and contract outward and inward, respectively, with a velocity and acceleration dictated in part by the port opening edge geometry. Thus, it is desirable to equip an opposed-piston engine for transitions of piston rings across port openings with less contact force than are presently achievable with prior art port edge constructions while optimizing the port opening edge shapes for optimal fluid flow into and out of the engine cylinder.

Port opening edge shapes that have positional continuity, tangential continuity, and curvature continuity allow for control of the motion (e.g., velocity, acceleration, and jerk) of the piston rings in the radial direction, with respect to the longitudinal axis of the engine cylinder. Controlling radial motion of the piston rings as they pass over the ports reduces or prevents contact force or stress that can disrupt the protective lubricant film that covers the surface of a cylinder's bore. This control alleviates or avoids scuffing and wear of both the bore surface and the piston rings, thus enhancing the durability of the engine.

Figure 3:
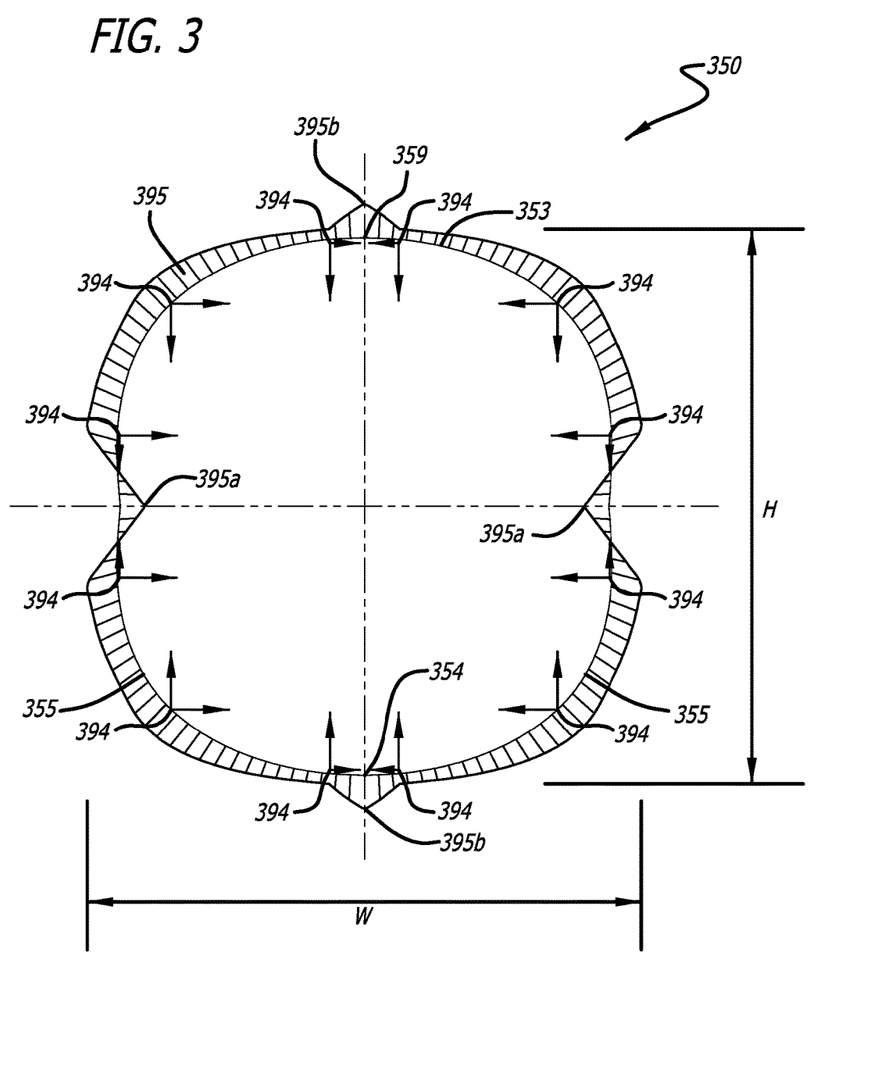
FIG. 3 illustrates a port opening edge shape and the magnitude of the curvature of the shape at various points along the shape.
Figure 4:
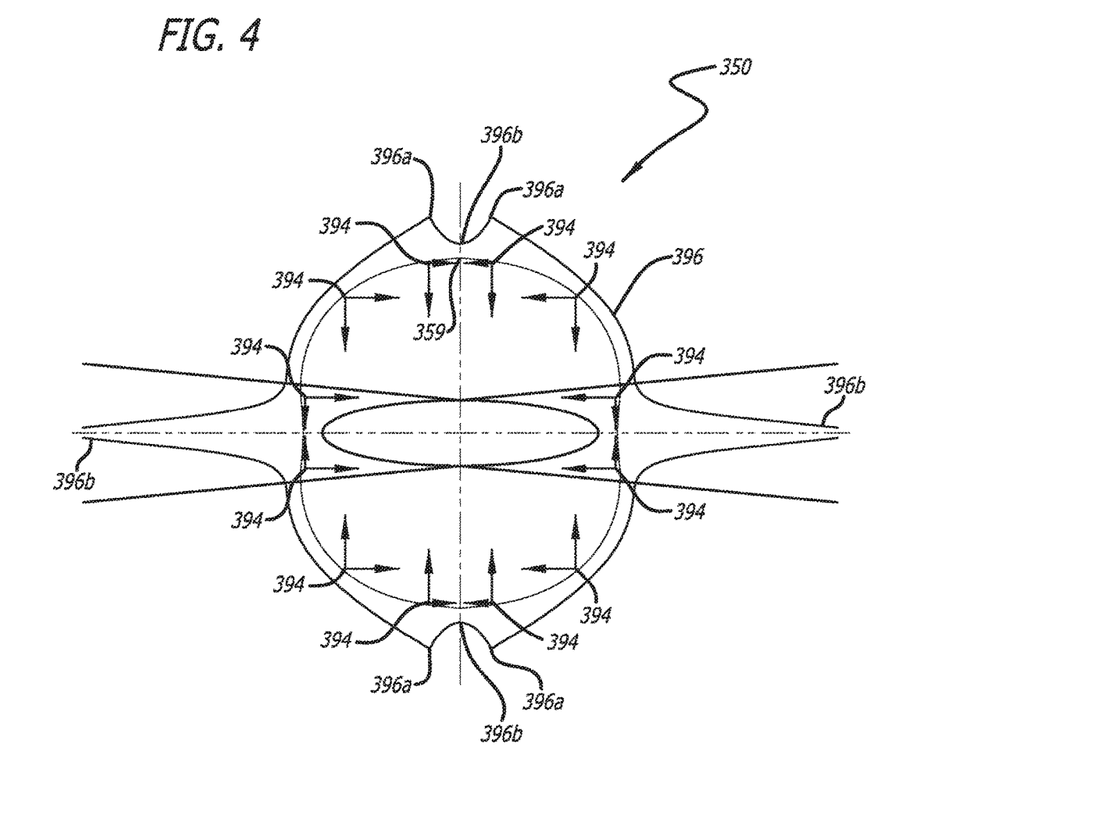
FIG. 4 illustrates a port opening edge shape and the magnitude of the radius of curvature of various points along the shape.

Port opening edge shapes with positional, tangential, and curvature continuity are typically smooth shapes; that is to say these shapes do not have sharp corners or segments with an extremely small radius of curvature adjacent to a portion with an extremely large radius of curvature. Some of the unfavorable radial motion of piston rings occurs when piston rings pass over port opening edge shapes that change or end abruptly. FIGS. 3 and 4 are examples of port opening edge shapes that have positional, tangential, and curvature continuity. These shapes have also been optimized for maximal fluid flow through the port, according to the method shown in FIG. 5 and described below.

Figure 5:
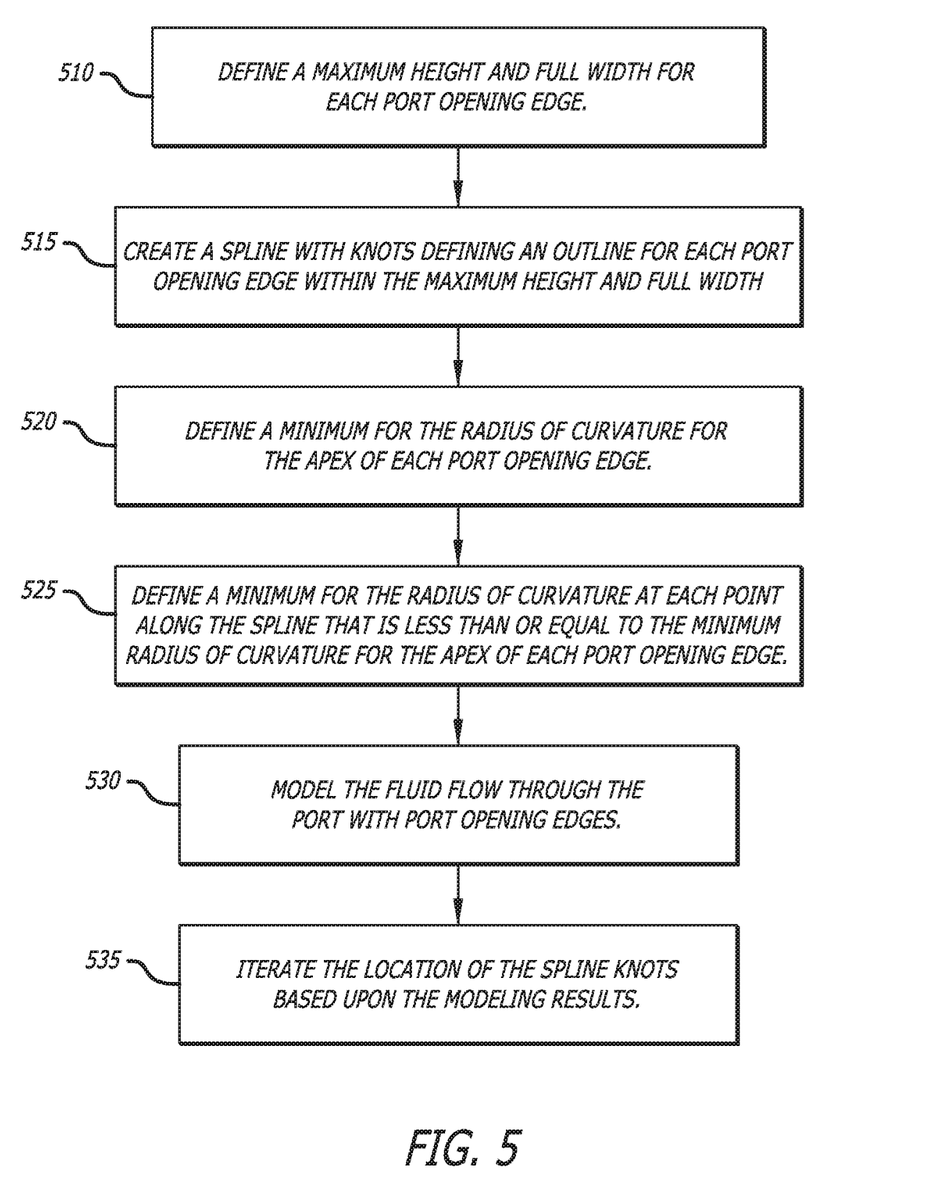
FIG. 5 is an exemplary flow diagram for a method for determining the shape of a port opening edge as described herein.

In the method shown in FIG. 5, design of a flow area-optimized port opening edge shape begins by defining a maximum height and a full width for each port opening edge shape, as in 510. The maximum height for each port opening edge shape will depend on factors, such as the desired timing of the port opening and closing, as well as the desired fluid flow (e.g., charge air flow, exhaust flow) rate. The full width for each port opening can be constrained by multiple factors, including the presence of port bridges with cooling channels, the strength of the material used to construct the cylinder (and thus the ports bridges), the circumference of the cylinder, as well as the desired fluid flow. The maximum height and full width values can be predefined, for example by a user or by design parameters.

Figure 6A:
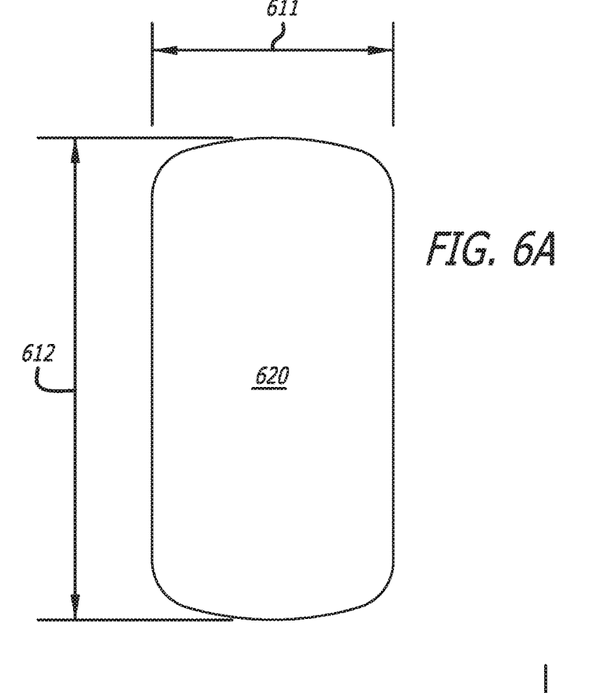
FIG. 6A and FIG. 6B illustrate two exemplary port opening edge shapes, both of which are constrained by the same maximum height and full width.
Figure 6B:
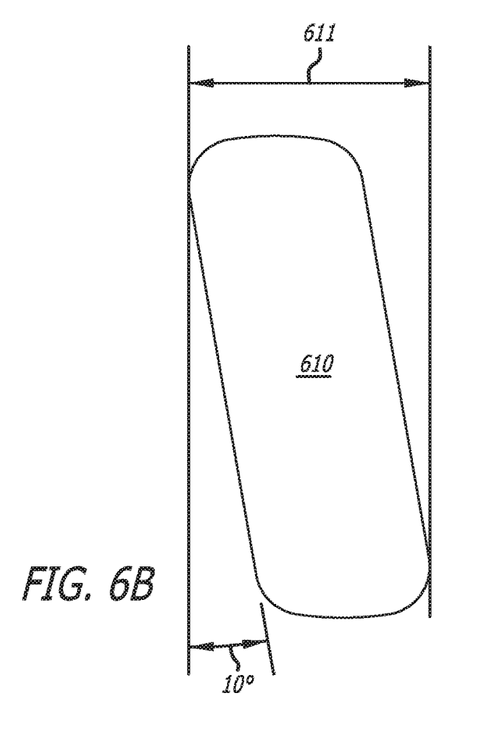

In some implementations, the port opening edge shape will have sides that are skewed with respect to the longitudinal axis of the engine cylinder. The degree of skew of the port opening edge shape will influence the flow area of the port opening. FIG. 6A and FIG. 6B show two ports with the same maximum height and full width constraints. For example, FIG. 6B shows a first port opening edge shape 610 that has a given height H 612 and is skewed 10 degrees but that is constrained to a full width of FW 611 will have a flow area that is less than a second port opening 620 of the same given height H that is constrained to the same full width FW, but not skewed, shown in FIG. 6A. Though this reduction in flow area may be undesirable in a port opening edge shape, such a configuration may have other benefits, for example distributing wear energy circumferentially along the edge of a piston ring in contact with such a port opening.

Once a maximum height and a full width for each port opening edge shape is defined, a spline is generated that defines an outline for each port opening edge within the maximum height and full width, as in 515. The generation of the spline is preferentially done utilizing one or more computers executing one or more algorithms that efficiently assess the suitability of suggested shapes for the spline. The determination of the port opening edge shape and consequentially the generation of the spline can involve the selection of multiple knots along the spline per quadrant of the area of the port opening edge shape. In determining the location of knots along the spline, each possible spline can be assigned a score based upon the conformance of the knots, and points along the spline between knots, to criteria (e.g., within the maximum height and full width; having an acceptable radius of curvature). For example, penalties will be assigned for a point that is outside of the maximum height and full width. Thus, the spline defining algorithm will encourage the selection of knots within the height and width constraints. Curvature constraints are also considered by this method. Testing multiple potential splines, including knot locations in various positions along the spline, can be done quickly using one or more computers executing an algorithm that accepts as input parameters at least the maximum height, full width, skew, and minimum radius of curvature. The nature of such testing makes it highly burdensome and to do by hand.

For the port opening edge shape, a location for an apex, or upper-most point in the top edge, can be determined, and a minimum for the radius of curvature of that apex can be defined, as in 520. The minimum for radius of curvature of the apex can be influenced by factors such as the tools and methods used for manufacturing the port openings, as well as the material used for the cylinder, particularly around the ports. Once the minimum radius of curvature for the port opening edge shape apex is defined, the minimum radius of curvature at every point along the spline can be defined, as in 525. The minimum radius of curvature at every point should be greater than or equal to the minimum radius of curvature for the apex. That is to say, the apex should have the smallest radius of curvature of any point along the port opening edge shape.

The port opening edge shape can be optimized to include only one peak or apex on the top edge of the opening, in some implementations. Alternatively, or additionally, the port opening edge shape can be optimized so that the top edge of the port opening edge shape is not flat, or near flat, over a large portion of the top edge. For example, the port opening edge shape can be optimized so that its top edge has only one point with a tangent with a slope of 0 (i.e., a horizontal tangent). Additionally, the port opening edge shape can be optimized so that adjacent to the peak or apex on the top edge, the top edge can have a non-zero slope, thereby preventing an abrupt change in radial velocity for any piston ring crossing the top edge. FIG. 3 and FIG. 4 show port opening edge shapes that are optimized to have only one peak and a non-zero slope along the top edge of the opening.

Figure 7A:
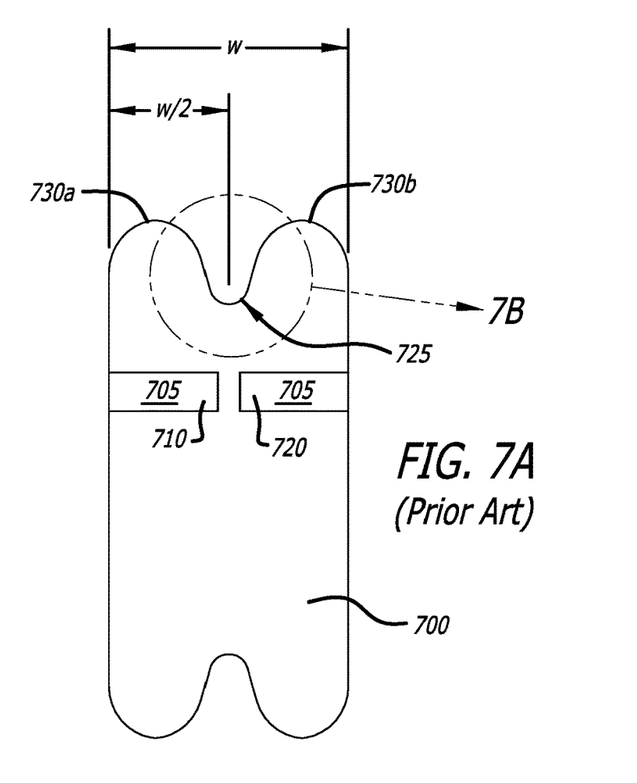
FIGS. 7A-7D illustrate an alternate, prior art port opening edge and its interaction with an exemplary piston ring.
Figure 7B:
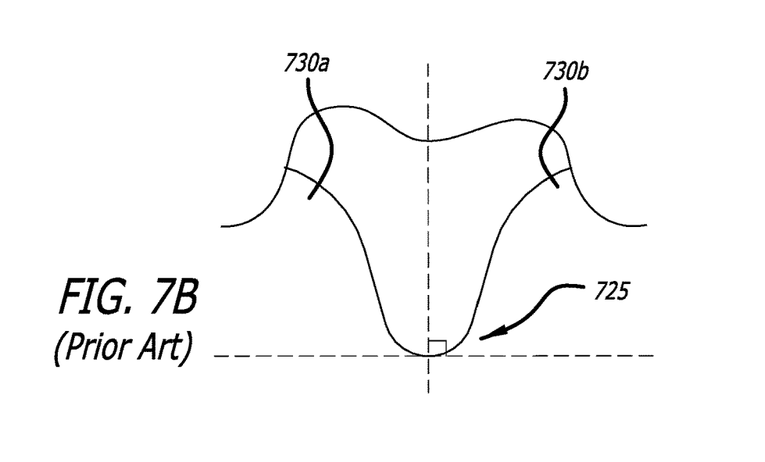

Schweitzer (Schweitzer, Paul, H., *Scavenging of Two-Stroke Cycle Diesel Engines*, The MacMillan Company, New York, 1949, pp. 50-54) describes a "Gothic arch" shaped port 700 which has two peaks 730a and 730b and a sharp downward protrusion 725 between the peaks 730a and 730b, shown in FIGS. 7A and 7B. A piston ring is shown moving through the port 700. The portion of the ring that is shown is the portion with the free ends 710, 720 of the piston ring which can cause the most wear on the cylinder at the port opening edge. By including a protrusion 725 from the timing edge horizontally centered, Schweitzer claims the cantilevered length 705 of a free ring with ends 710, 720 in the port 700 would be halved. This would limit radial protrusion (750a, 750b in FIGS. 7C and 7D, respectively) into the port 700 and limit clipping. However, the protrusion presents a tangent edge to the ring, forcing high radial acceleration inward and high contact pressure in turn. Schweitzer admits that radial profiling (e.g., smoothing of the radial protrusion along the bore surface) of the port opening edge shape is necessary to limit this effect. Any radial profiling of the shape from inside the cylinder is difficult and expensive because tooling is required to reach all the way from the tail of the cylinder as opposed to reaching from the outside in.

Figure 7C:
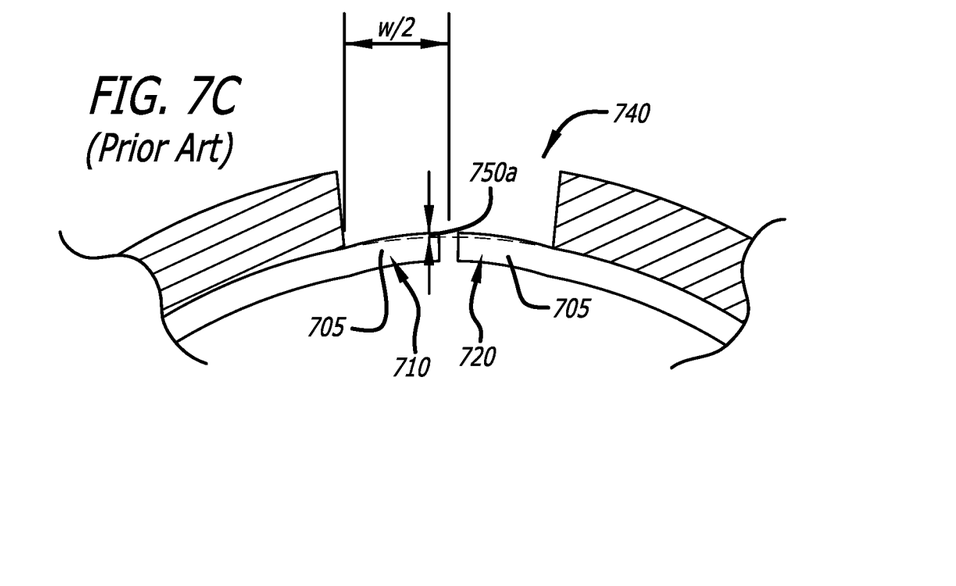

As indicated above, FIG. 7C shows a cross-sectional view of a portion of a cylinder wall that includes a port opening 740 and a cantilevered portion 705 of a ring that is passing adjacent to the port opening in which the gap in the piston ring is in a first position with the left end 710 of the ring a distance, w/2, where the sharp downward protrusion 725 of the Gothic arch would reach into the port opening, theoretically limiting port clipping by meeting the piston ring where it is extending by a first protrusion amount 750a radially outward from the center of the cylinder.

Figure 7D:
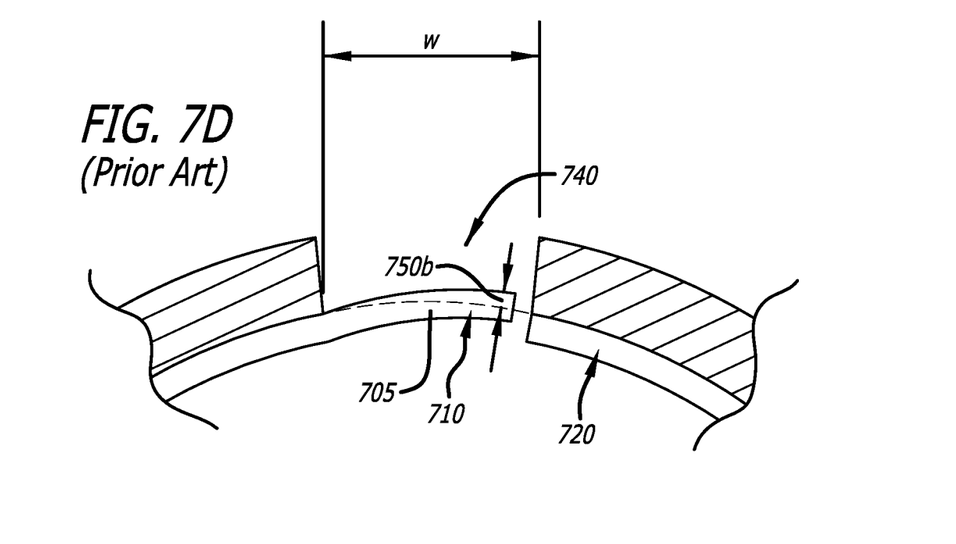

FIG. 7D shows a cross-sectional view of a portion of a cylinder wall that includes a port opening 740 and a cantilevered portion 705 of a ring that is passing adjacent to the port opening in which the gap in the piston ring is in a second position with the left end 710 of the ring spans a distance, w, that is equal to the width of the port opening, or nearly so. This drawing shows an exemplary second protrusion amount 750b by which the piston ring extends outward from the center of the cylinder. This second protrusion amount is greater than the first protrusion amount, shown in FIG. 7C.

FIG. 7C and FIG. 7D support the argument of Schweitzer that the Gothic arch configuration for a port opening edge shape would reduce wear best. However, as mentioned above, Schweitzer also acknowledges that this configuration works most optimally when the inside portion of the protrusion of the Gothic arch, along the cylinder bore wall, is relieved. In some implementations, it is not practical to round sharp edges in the cylinder bore wall. Alternatively, in some implementations, additive machining, honing, polishing, electrochemical processes, and the like can be used to round sharp edges in the cylinder bore wall. In the implementations where sharp edges in the cylinder bore wall are not softened or removed, the Gothic arch may not be the best configuration for a port opening edge shape; in such implementations, port opening edge shapes with only one peak along the top edge, as described herein above, may be the optimal configuration for preventing wear and undesirable movement in the piston rings and cylinder bore surface.

The algorithm will ensure that the spline, along with the radii of curvature for various points along the spline, are within, or as close to, the specified parameters. Once a port opening edge shape is defined, fluid flow through a port having that port opening edge shape can be modeled, using for example a computer or a prototype engine, as in 530. Once the results for fluid flow and engine performance are received from the model, the spline and knots can be redefined to improve fluid flow or other performance parameters, as in 535. The iterations can continue until performance thresholds are reached. The performance thresholds can be predefined. An optimized port opening edge shape can be used to construct a cylinder for an opposed-piston engine, such as the engine described above.

FIG. 3 shows an exemplary port opening edge shape 350 designed to optimize fluid flow while minimizing undesirable piston ring motion. The magnitude of the curvature 395 of the port opening edge shape 350 is shown as a trace attached to the port edge via combs. The port opening edge shape 350 was designed to be constrained by a maximum height H and a full width W. The port opening edge shape 350 is similar to the port opening edge shapes shown in FIGS. 2A through 2F, in that it has a top edge 353, a bottom edge 354, and side edges 355. Similar to the port opening edge shape shown in FIGS. 2E and 2F, the port opening edge shape 350 has an apex 359, or peak, along the top edge 353. Also seen in FIG. 3 are the knots 394 along the spline that define the port opening edge shape 350, as well as the curvature along the spline as represented by the trace 395. Along this trace 395, there are points 395a, 395b, where the curvature of the port opening edge shape changes dramatically, but not suddenly. These areas where the curvature changes dramatically are located in the vicinity of the middle 395a of the side edges 355 and in the area around 395b the apex 359 and the mid-point of the bottom edge 354.

FIG. 4 shows the exemplary port opening edge shape 350 shown in FIG. 3 with a trace 396 showing the radius of curvature of points along the port opening edge shape 350. Along the trace 396, there are points 396a, 396b where the magnitude of the radius of curvature is greatly different from the adjacent portions of the port opening edge shape 350. These points include the areas around the mid-point of each side edge 396b and the areas around 396a the apex 359. As described above, the apex 359 will be constrained to have a radius of curvature much smaller than the rest of the port opening edge shape 350. This is reflected in the dip 396b seen in the trace 396.

The scope of patent protection afforded the novel tools and methods described and illustrated herein may suitably comprise, consist of, or consist essentially of the elements a port opening edge shape for a port in a cylinder of an opposed-piston combustion engine. Further, the novel tools and methods disclosed and illustrated herein may suitably be practiced in the absence of any element or step which is not specifically disclosed in the specification, illustrated in the drawings, and/or exemplified in the embodiments of this application. Moreover, although the invention has been described with reference to the presently preferred embodiment, it should be understood that various modifications can be made without departing from the spirit of the invention.

Accordingly, the invention is limited only by the following claims.

What is claimed is:

1. A port opening edge shape for a port in a cylinder of an opposed-piston combustion engine, the cylinder including a bore surface and a sidewall, the port comprising at least one array of circumferentially-spaced port openings near an end of the cylinder, each port opening extending from the bore through the sidewall and having the port edge shape at the bore surface, the port opening edge shape comprising:
   a top edge oriented toward a center portion of the cylinder;
   a bottom edge oriented toward an end of the cylinder;
   a first and second side edge connecting the top edge and the bottom edge; and
   an apex located along the top edge, the apex comprising a minimum radius of curvature equal to or greater than a minimum radius for the port opening edge shape, wherein the port opening edge shape comprises curvature continuity.

2. A port opening edge shape for a port in a cylinder of an opposed-piston combustion engine, the cylinder including a bore surface and a sidewall, the port comprising at least one array of circumferentially-spaced port openings near an end of the cylinder, each port opening extending from the bore through the sidewall and having the port edge shape at the bore surface, the port opening edge shape comprising:
- a top edge oriented toward a center portion of the cylinder;
- a bottom edge oriented toward an end of the cylinder;
- a first and second side edge connecting the top edge and the bottom edge; and
- an apex located along the top, the apex comprising a minimum radius of curvature equal to or greater than a minimum radius for the port opening edge shape, wherein the port opening edge shape is defined by a spline bound by:
- a predefined maximum port opening height;
- a predefined port opening full width;
- a minimum radius of curvature for any point along the spline; and
- curvature continuity along the spline.

3. A cylinder of an opposed-piston combustion engine, the cylinder comprising:
- a sidewall;
- a bore surface; and
- a port comprising at least one array of circumferentially-spaced port openings near an end of the cylinder, each port opening extending from the bore, through the sidewall, and having a port opening edge shape according to either claim 1 or claim 2, the port opening edge shape being at the bore surface.

4. An opposed-piston combustion engine comprising a cylinder, the cylinder comprising:
- a sidewall;
- a bore surface; and
- a port comprising at least one array of circumferentially-spaced port openings near an end of the cylinder, each port opening extending from the bore, through the sidewall, and having a port opening edge shape according to either claim 1 or claim 2, the port opening edge shape being at the bore surface.

5. A port in a cylinder of an opposed-piston combustion engine, the cylinder including a bore surface and a sidewall, the port comprising at least one array of circumferentially-spaced port openings near an end of the cylinder, each port opening extending from the bore through the sidewall and having a port opening edge shape at the bore surface according to either claim 1 or claim 2.

* * * * *